United States Patent [19]

Oyama et al.

[11] Patent Number: 4,674,008

[45] Date of Patent: Jun. 16, 1987

[54] DISPLAY ELEMENT ATTACHMENT HOLDER

[75] Inventors: Minoru Oyama; Ryoji Kinugawa, both of Furukawa, Japan

[73] Assignee: Alps Electric Co., Ltd., Japan

[21] Appl. No.: 813,648

[22] Filed: Dec. 26, 1985

[30] Foreign Application Priority Data

Dec. 25, 1984 [JP] Japan .......................... 59-200035[U]

[51] Int. Cl.⁴ .............................................. H05K 7/06
[52] U.S. Cl. .................................... 361/417; 361/400; 361/419; 361/420; 439/56
[58] Field of Search .............................. 248/27.1, 27.3; 339/17 C, 17 LC, 17 LM, 17 D; 361/380, 400, 405, 406, 413, 415, 417–420

[56] References Cited

U.S. PATENT DOCUMENTS 4,439,000 3/1984 Kaufman et al. ............. 339/17 LM

FOREIGN PATENT DOCUMENTS 2714168 10/1978 Fed. Rep. of Germany ... 339/17 D
2718442 11/1978 Fed. Rep. of Germany ...... 361/400
2747272 4/1979 Fed. Rep. of Germany ...... 361/400

Primary Examiner—A. D. Pellinen
Assistant Examiner—Gregory D. Thompson
Attorney, Agent, or Firm—Guy W. Shoup

[57] ABSTRACT

A snap-attachable holder for holding a number of display elements is adapted to engage with the edge portion of a printed circuit board so that the holder does not add substantially to the thickness of the printed circuit board. The holder is of an L-shaped cross section and has vertical protrusions and pawls for aligning with and snappingly engaging to the printed circuit board. The holder further has guide slots for guiding the terminals of each display element so that they protrude upwardly in the same direction as the pawls.

3 Claims, 4 Drawing Figures

DISPLAY ELEMENT ATTACHMENT HOLDER

BACKGROUND OF THE INVENTION

1. Field of the Invention

The present invention relates to a structure of a display element attachment holder in a display assembly equipment such as an air-conditioning system.

2. Description of the Prior Art

FIG. 4 is a perspective view for showing attachment of a conventional display element attachment holder 2. In the drawing, there is provided a printed substrate 1 in which pawl insertion holes 1a each substantially squarely shaped are equidistantly formed such that pawls 3 of the display element attachment holder 2 may be inserted respectively thereinto. The display element attachment holder 2 is made of synthetic resin material or the like. Provided at its upper surface are display element attachment portions 4 for attaching display elements 5 respectively and provided at its lower surface are pawls 3 which are inserted through pawl insertion holes 1a of the printed substrate 1 respectively. The display element attachment portions 4 and the pawls 3 are formed integrally with the display element attachment holder 2. Each pawl 3 is hook-like shaped and formed perpendicularly onto the lower surface of the display element attachment holder 2. Each display element attachment portion 4 is shaped in the form of a quadrilateral pillar and formed with a terminal insertion hole 4a having a substantially rectangular cross section at the center portion of the display element attachment portion 4 for communicating terminals 5a of display element 5 to the rear portion of the display element attachment holder 2.

Next, description will be made as to attachment of the display element attachment holder 2. First, terminals 5a of each display element 5 are inserted through the terminal insertion holes 4a of the display element attachment portion 4 and thereafter the respective pawls 3 of the display element attachment holder 2 are inserted through the corresponding pawl insertion holes 1a of the substrate 1 and their hook-like portions snap around the bottom of the substrate 1 to thereby keep the engagement between the display element attachment holder 2 and the substrate 1.

As described above, the conventional display element attachment holder 2 has disadvantages that the assembly of the display element attachment holder 2 and the substrate 1 becomes thicker in height because the holder 2 is attached onto the upper surface of the substrate 1 so that it is impossible to reduce the products in size as well as in thickness, and moreover the attachment accuracy of the holder 2 onto the substrate 1 as well as the arrangement accuracy of the display elements 5 are not so good because the holder 2 aligned to the substrate 1 by respectively correspondingly inserting the pawls 3 of the holder 2 into the pawl insertion holes 1a of the substrate 1.

SUMMARY OF THE INVENTION

An object of the present invention is therefore to eliminate the disadvantages of the prior art display element attachment holder.

Another object of the present invention is to reduce the size and thickness, the assembly of the display element attachment holder and the substrate.

Another object is to improve the attachment accuracy of the display element attachment holder to the substrate as well as the arrangement accuracy of the display elements.

To attain the objects as described above, according to the present invention, the display element attachment holder comprises a bottom plate portion; a front plate portion formed uprightly from and integrally with the bottom plate portion such that the display element attachment holder is substantially L-shaped in cross-section; engagement-holding pawls upwardly formed on the upper surface of the bottom plate portion and located equidistantly from each other in the longitudinal direction display element attachment portions each shaped in the form of a rectangular pillar and integrally formed on the front plate portion, each of the display element attachment portions being formed between adjacent engagement holding pawls and having a display element insertion portion. The display element attachment holder is engaged with an printed substrate such that an end portion of the printed substrate is mounted on the upper surface of the bottom plate portion of the display element attachment holder while respectively inserting the engagement-holding pawls into pawl insertion holes correspondingly formed in the printed substrate so that the display element attachment holder is fixedly attached to the side end surface of the substrate.

The above and other objects, features, and advantages of the present invention will be more apparent from the following description with reference to the accompanying drawings.

DETAILED DESCRIPTION OF PREFERRED EMBODIMENT

Figure 1:
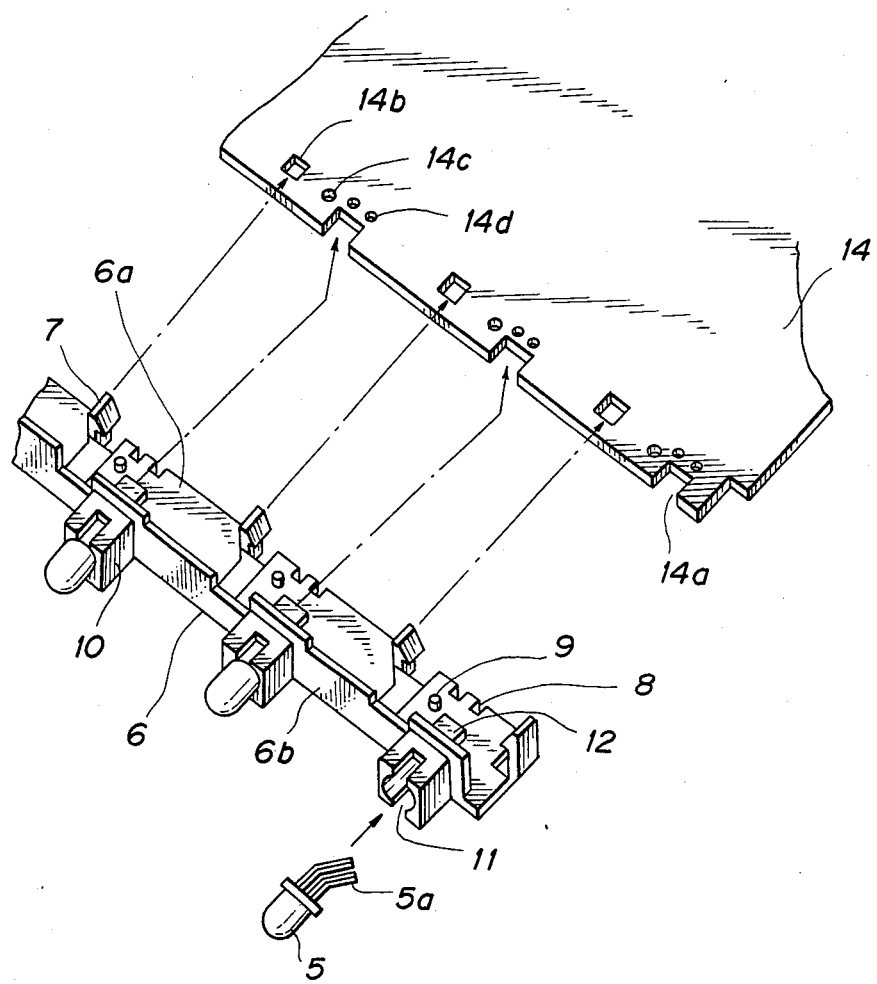
FIG. 1 is an perspective view showing an embodiment of the display element attachment holder according to the present invention.

An embodiment illustrated in the drawings according to the present invention will be described in detail hereunder.

Figure 2:
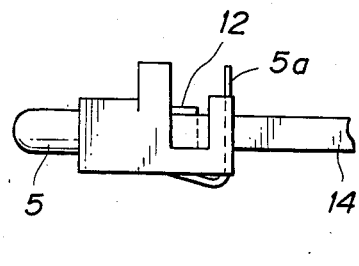
FIG. 2 is a side view showing the state where the display element attachment holder of FIG. 1 and a printed substrate are attached to each other.
Figure 3:
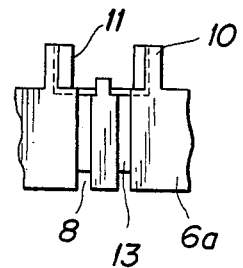
FIG. 3 is a partial enlarged bottom plan view showing the display element attachment holder.
Figure 4:
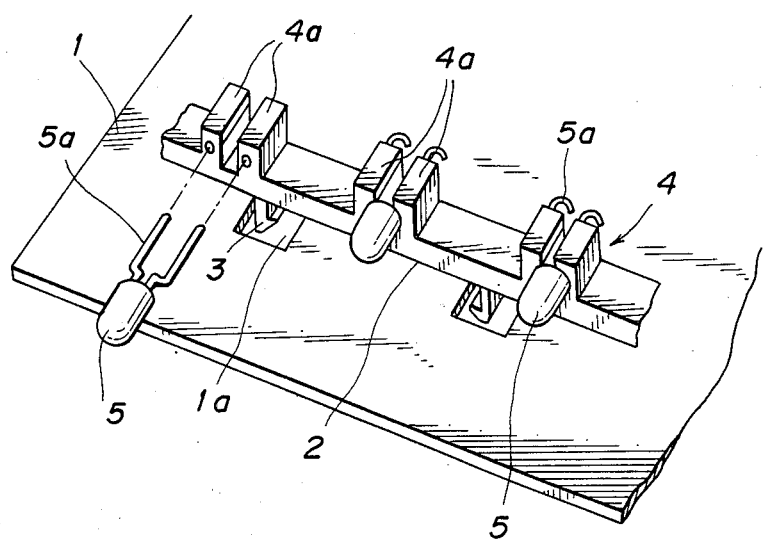
FIG. 4 is a perspective view showing the conventional display element attachment holder.

FIGS. 1 to 3 show an embodiment of the present invention in which the same part as those in FIG. 4 are correspondingly numbered. In FIGS. 1 to 3, each of display elements 5 has terminals 5a made of a conductive plate-like material or the like. A display element attachment holder 6 is made of a synthetic resin material or the like and constituted by a bottom plate portion 6a and a front plate portion 6b formed uprightly from and integrally with the bottom portion 6a such that the holder 6 has an L-shaped cross-section. A plurality of hook-like engagement pawls 7 for engaging with a printed substrate 14 which will be described later are formed vertically upwardly on the upper surface of the bottom plate portion 6a at the transversely edge portions thereof and arranged substantially equidistantly from one another in the longitudinal direction of the bottom plate portion 6a. A pair of guide slots 8 each having a rectangular cross-section are formed vertically in the back edge of the bottom plate portion 6a at a substantially central portion between adjacent engagement pawls 7 so that a portion of terminals 5a can be inserted in the guide slots 8 respectively. A cylindrical small protrusion 9 is formed on the bottom plate portion 6a at a substantially central portion between each pair of terminal guide slots 8 and the engagement-holding pawl 7 located at the left side of the slot 8 in the drawing as well as well as at a substantially central portion in the transverse direction of the bottom plate portion 6a. On the front surface of the front plate portion 6b, a plurality of display element attachment portions 10 are longitudinally substantially equidistantly formed at positions respectively correspondingly in opposition to the terminal guide slots 8, each of the display attachment portions 10 being shaped in the form of a quadrilateral pillar and projectd outward from perpendicularly to the front plate portion. In each of the display element attachment portions 10, there is provided a display element insertion portion 11 having a circular shape in cross-section and being extended from a side surface of the display element attachment portion 10 in opposition to the front surface of the front plate portion 6b toward the front plate portion 6b per se. A plurality of protrusions 12 each shaped in the form of a quadrilateral pillar are formed on the upper surface of the bottom plate portion 6a integrally therewith. Each of the protrusions 12 is disposed at a position in opposition to the corresponding pair of terminal guide slots 8 and closely in contact with the back surface of the front plate portion 6b. In the bottom plate portion 6a there are formed terminal insertion slots 13 each having a rectangular cross section and respectively communicated with the terminal guide slots 8, the terminal insertion slots 13 being extended from the respective terminal guide slots 8 to the front plate portion 6b. In a substantially rectangularly shaped printed substrate 14, there are formed U-shaped notches 14a longitudinally equidistantly arranged at the transverse end portions of the substrate 14; pawl insertion holes 14b each having a square shape in cross sections and each formed at a substantially central portion between every adjacent two of the notches 14a; positioning holes 14c each formed at a substantially central portion between the corresponding pawl insertion hole 14b and the corresponding notch 14a; and a pair of terminal insertion holes 14d formed in the vicinity of the bottom portion of the U-shaped notch 14a and arranged in parallel to the bottom portion of the notch 14a.

Next description will be made as to the assembling of the display element attachment holder 6 to the printed substrate 14. First, each of the display elements 5 is inserted into corresponding one of the display element insertion portions 11 of the display element attachment holder 6 and the terminals 5a secured to each display element 5 are respectively inserted through the vertical terminal insertion slots 8. Thereafter, the ends of the terminals 5a are inserted through the terminal insertion holes 14d respectively and the display element attachment holder 6 and the printed substrate 14 are attached to each other by respectively correspondingly engaging the engagement-holding pawls 7, the protrusions 12 and the small protusions 9 of the holder 6 with the pawl insertion holes 14b, the notches 14a and the positioning holes 14c of substrate 14.

As described above, the display element attachment holder 6 is advantageous in that the printed substrate 14 is mounted at its end portion onto the upper surface of the bottom plate portion 6a of the display element attachment holder 6 in the form of a substantially L-shape in cross section so that the assembly of the display element attachment holder 6 and the printed substrate 14 can be made thinner in height and therefore products can be reduced in size as well as in thickness, and the display element attachment holder 6 is made to be in close contact with both the side and lower surfaces of the printed substrate 14 so tht the alignment of the display elements 5 can be made regular.

What is claimed is:

1. A display element attachment holder comprising:
   a bottom plate portion;
   a front plate portion formed uprightly from and integrally with said bottom plate portion such that said display element attachment holder is substantially L-shaped in cross-section; engagement-holding pawls upwardly formed on the upper surface of said bottom plate portion and spaced in the longitudinal direction of said bottom plate portion; and
   display element attachment portions each shaped in the form of a rectangular pillar and integrally formed on said front plate portion, each of said display element attachment portions being formed between adjacent engagement-holding pawls and having a display element insertion portion;
   said display element attachment holder being engaged with a substrate such that an end portion of the substrate is mounted on the upper surface of said bottom plate portion of said display element attachment holder with said engagement-holding pawls in pawl insertion holes formed in said substrate so that the display element attachment holder is fixedly attached to the end portion of said substrate.

2. A display element attachment holder according to claim 1, in which paired terminal guide slots are formed in said bottom plate portion at its edge for allowing terminals of a display element to be inserted respectively through said terminal guide slots; and paired terminal insertion slots are formed in the lower surface of said bottom plate portion and respectively communicating with said paired terminal guide slots for allowing said terminals to be also respectively inserted through said terminal insertion slots.

3. A display element attachment holder according to claim 1, in which a plurality of small protrusions are formed on the upper surface of said bottom plate portion inserted into positioning holes formed in said substrate when said display element attchment holder is attached to said substrate; and a plurality of large protrusions formed on the upper surface of said bottom plate portion inserted into slots formed in the end portion of said substrate when said display element attchment holder is attached to said substrate.

* * * * *